United States Patent
Lee

(10) Patent No.: US 7,242,636 B2
(45) Date of Patent: Jul. 10, 2007

(54) CLOCK CONTROL CIRCUIT AND SEMICONDUCTOR MEMORY DEVICE INCLUDING THE SAME AND INPUT OPERATION METHOD OF SEMICONDUCTOR MEMORY DEVICE

(75) Inventor: Yin Jae Lee, Kyeongki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 8 days.

(21) Appl. No.: 11/319,550

(22) Filed: Dec. 29, 2005

(65) Prior Publication Data

US 2007/0086269 A1    Apr. 19, 2007

(30) Foreign Application Priority Data

Oct. 14, 2005    (KR) ..................... 10-2005-0096916

(51) Int. Cl.
*G11C 8/00*    (2006.01)
(52) U.S. Cl. ............... 365/233; 365/230.08; 365/233.5
(58) Field of Classification Search ............... 365/233, 365/230.08, 233.5
See application file for complete search history.

(56) References Cited

U.S. PATENT DOCUMENTS 6,809,989 B2*   10/2004   Takahashi et al. ..... 365/230.08
6,977,865 B2*   12/2005   Jeong ......................... 365/233

FOREIGN PATENT DOCUMENTS

KR    1020020018944    3/2002

* cited by examiner

*Primary Examiner*—Huan Hoang
(74) *Attorney, Agent, or Firm*—Lowe Hauptman & Berner LLP

(57) ABSTRACT

The present invention relates to a clock control circuit that can reduce power consumption in the input operation of an address signal and control signals and semiconductor memory device including the same, and an input operation method of the semiconductor memory device. The clock control circuit accordance to the present invention generates a control clock signal only when external address signals or external control signals are substantially input. Therefore, unnecessary power consumption a power noise phenomenon can be reduced.

24 Claims, 5 Drawing Sheets

CLOCK CONTROL CIRCUIT AND SEMICONDUCTOR MEMORY DEVICE INCLUDING THE SAME AND INPUT OPERATION METHOD OF SEMICONDUCTOR MEMORY DEVICE

BACKGROUND

1. Field of the Invention

The present invention relates to semiconductor memory devices and more particularly, to a clock control circuit that generates clock signals to control the input operations of an address buffer and control signal buffers of a semiconductor memory device and semiconductor memory device including the same and an input operation method of the semiconductor memory device.

2. Discussion of Related Art

In general, in semiconductor memory devices that operate in synchronization with a clock signal in the same manner as synchronous semiconductor memory devices, an address buffer receives an address signal in synchronization with the clock signal. Furthermore, a control signal buffer also receives an external control signal in synchronization with the clock signal. The input operation of the address buffer and the control signal buffers in the related art will be described below with reference to FIGS. 1 and 2.

FIG. 1 is a block diagram schematically showing a clock control circuit and an address signal buffer and control signal buffers of a semiconductor memory device in the related art. FIG. 2 is a timing diagram of signals related to the operation of the clock control circuit shown in FIG. 1 and buffers for receiving address signals and control signals.

The timing diagram of FIG. 2 is related to the operation of the buffers that receive an address signal and control signals in data write and read operations of the semiconductor memory device.

Referring first to FIG. 1, output terminals of a clock buffer 10 and an address valid signal (/ADV) buffer 20 are connected to input terminals of a clock repeater 30, respectively. The clock repeater 30 includes a clock generator 31 and a control logic circuit 32.

The clock generator 31 includes a pulse signal generator 33 and a delay circuit 34. Furthermore, the delay circuit 34 includes inverters 35, 36 that are connected in series. The control logic circuit 32 includes inverters 37, 38 that are connected in series.

The clock buffer 10 receives an external clock signal (EXCLK) and outputs an input clock signal (CLK). The /ADV the buffer 20 receives an address valid signal (/ADV) and outputs an input address valid signal (ADV0) and an internal address valid signal (KADV), in response to an enable signal (EN) and a control clock signal (CTDB_AC). The internal address valid signal (KADV) is synchronized to the control clock signal (CTDB_AC).

The clock repeater 30 outputs the control clock signal (CTDB_AC) according to the input clock signal (CLK), delays the input address valid signal (ADV0) and outputs a control signal (ADV0)_A).

The address buffer 40 receives an external address signal (ADDR) and outputs an internal address signal (Ai), in response to the control clock signal (CTDB_AC). Furthermore, the address buffer 40 outputs an address transition detection signal (ATD) in response to the control signal (ADV0)_A) and the external address signal (ADDR).

Meanwhile, a plurality of control signal buffers 50A1 to 50AK) (K is an integer) receives external control signals (EXCTL1 to EXCTLK) (K is an integer) and outputs internal control signals (CTL1 to CTLK) (K is an integer), respectively, in response to the control clock signal (CTDB_AC).

As shown in FIG. 2, the clock repeater 30 consecutively outputs the control clock signal (CTDB_AC) whenever the input clock signal (CLK) is received (i.e., whenever the input clock signal (CLK) is toggled). Therefore, even in a period where the valid external address signal (ADDR) is not received, the address buffer 40 consecutively operates in response to the control clock signal (CTDB_AC).

On the other hand, some of the external control signals (EXCTL1 to EXCTLK) are input to the semiconductor memory device only in a specific period similar to the external address signal (ADDR). In this case, control signal buffers (some of 50A1 to 50AK) that receive some of the external control signals (EXCTL1 to EXCTLK), respectively, consecutively operate in response to the control clock signal (CTDB_AC) even in a period where some of the external control signals (some of EXCTL1 to EXCTLK) are not input.

If the clock repeater 30, the address buffer 40 and the control signal buffers (some of 50A1 to 50AK) consecutively operate, an amount of current that is unnecessarily consumed is increased. This will be described in more detail. Each of the inverters 35 to 38 of the clock repeater 30 includes a plurality of transistors (not shown). The transistors include a relatively high current driving ability The reason why the transistors have a relatively high current driving ability is to supply the control clock signal (CTDB_AC) to the address buffer 30 and control signal buffers (some of 50A1 to 50AK) having a relatively high resistance component. Since the transistors have a relatively high current driving ability as described above, a relatively great amount of current is consumed when the transistors are driven.

Furthermore, power consumption is increased because the address buffer 30 and the control signal buffers (some of 50A1 to 50AK) consecutively operate whenever the control clock signal (CTDB_AC) is toggled.

The clock repeater 30 of the related art is problematic in that an amount of current that is unnecessarily consumed is increased since it consecutively toggles the control clock signal (CTDB_AC) regardless of the address signal or the external control signal as described above.

The problem becomes more profound when semiconductor memory devices including the clock repeater 30 are applied to mobile products. That is, mobile products must operate for a long period of time at low power. Therefore, to reduce power consumption, power consumption of semiconductor chips included in mobile products must be reduced. However, a problem arises because mobile products cannot operate for a long period of time because power consumption of semiconductor memory devices is increased due to the consecutive operation of the clock repeater 30.

SUMMARY OF THE INVENTION

An advantage of the present invention is that it provides a clock control circuit of a semiconductor memory device, in which a control clock signal is generated only when an external address signal or an external control signal is substantially input, reducing unnecessary power consumption.

Another advantage of the present invention is that it provides a semiconductor memory device including a clock control circuit, in which a control clock signal is generated only when an external address signal or an external control signal is substantially input, reducing unnecessary power consumption.

Further another advantage of the present invention is that it provides an input operation method of an address signal or a control signal of a semiconductor memory device, in which a control clock signal is generated only when an external address signal or an external control signal is substantially input, reducing unnecessary power consumption.

A clock control circuit of a semiconductor memory device according to an aspect of the present invention includes a first clock generator and a second clock generator. The first clock generator outputs a first control clock signal in response to an input clock signal and an internal address valid signal. The first clock generator can generate the first control clock signal only while the internal address valid signal is input. The second clock generator generates a second control clock signal based on the input clock signal. First buffers can receive first external signals, respectively, and output first internal signals to an internal circuit, in response to the first control clock signal. Second buffers can receive second external signals, respectively, and output second internal signals to an internal circuit, in response to the second control clock signal.

A semiconductor memory device including a clock control circuit according to another aspect of the present invention includes a clock buffer, a clock control circuit, an address valid signal buffer, a first input buffer unit and a second input buffer unit. The clock buffer receives the external clock signal and outputs an input clock signal. The clock control circuit outputs first and second control clock signals in response to the input clock signal and an internal address valid signal. The address valid signal buffer receives an address valid signal and outputs the internal address valid signal, in response to a first buffer enable signal and the second control clock signal. The first input buffer unit receives first external signals and outputs first internal signals to an internal circuit, in response to the first control clock signal. The second input buffer unit receives second external signals and outputs second internal signals to the internal circuit, in response to the second control clock signal. The clock control circuit generates the first control clock signal only while the internal address valid signal is enabled.

An address input operation method of a semiconductor memory device according to further another aspect of the present invention includes the steps of outputting an input clock signal in response to the external clock signal, generating a first control clock signal based on the input clock signal, generating an internal address valid signal in response to an address valid signal and the first control clock signal, generating a second control clock signal only during a predetermined time in response to the input clock signal and the internal address valid signal, and receiving an external address signal and outputting an internal address signal and an address transition detection signal, in response to the second control clock signal.

An input operation method of a semiconductor memory device according to further another aspect of the present invention includes the steps of outputting an input clock signal in response to the external clock signal, generating a first control clock signal based on the input clock signal, generating an internal address valid signal in response to an address valid signal and the first control clock signal, generating a second control clock signal only during a predetermined time in response to the input clock signal and the internal address valid signal, receiving the first control signals in response to the first control clock signal, and receiving the second control signals in response to the second control clock signal.

DETAILED DESCRIPTION OF PREFERRED EMBODIMENTS

The present invention will now be described in connection with preferred embodiments with reference to the accompanying drawings.

Figure 1:
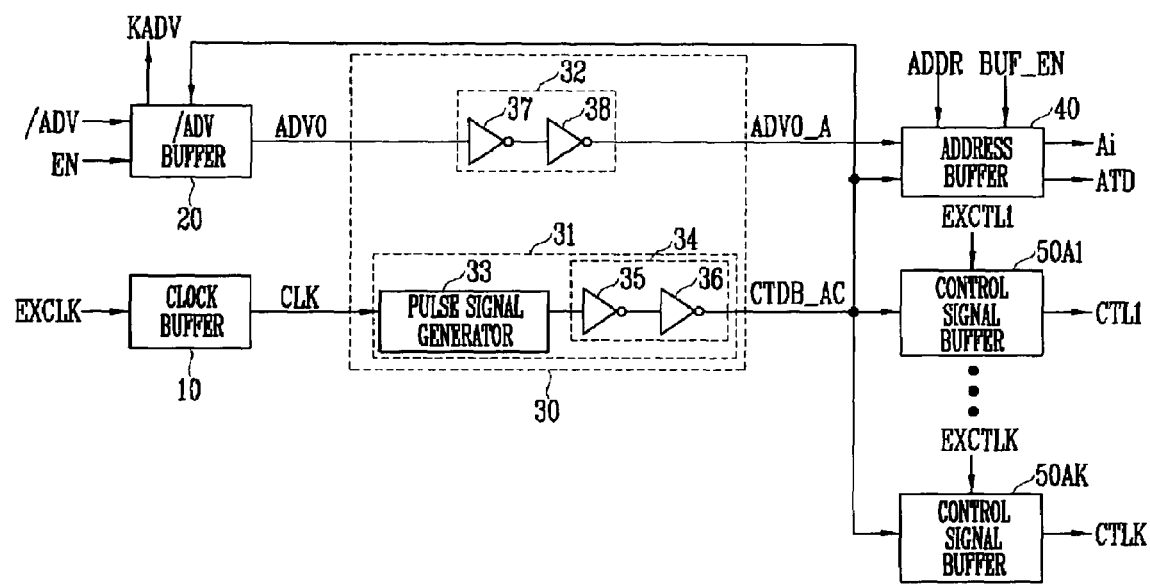
FIG. 1 is a block diagram schematically showing a clock control circuit and an address signal buffer and control signal buffers of a semiconductor memory device in the related art.
Figure 2:
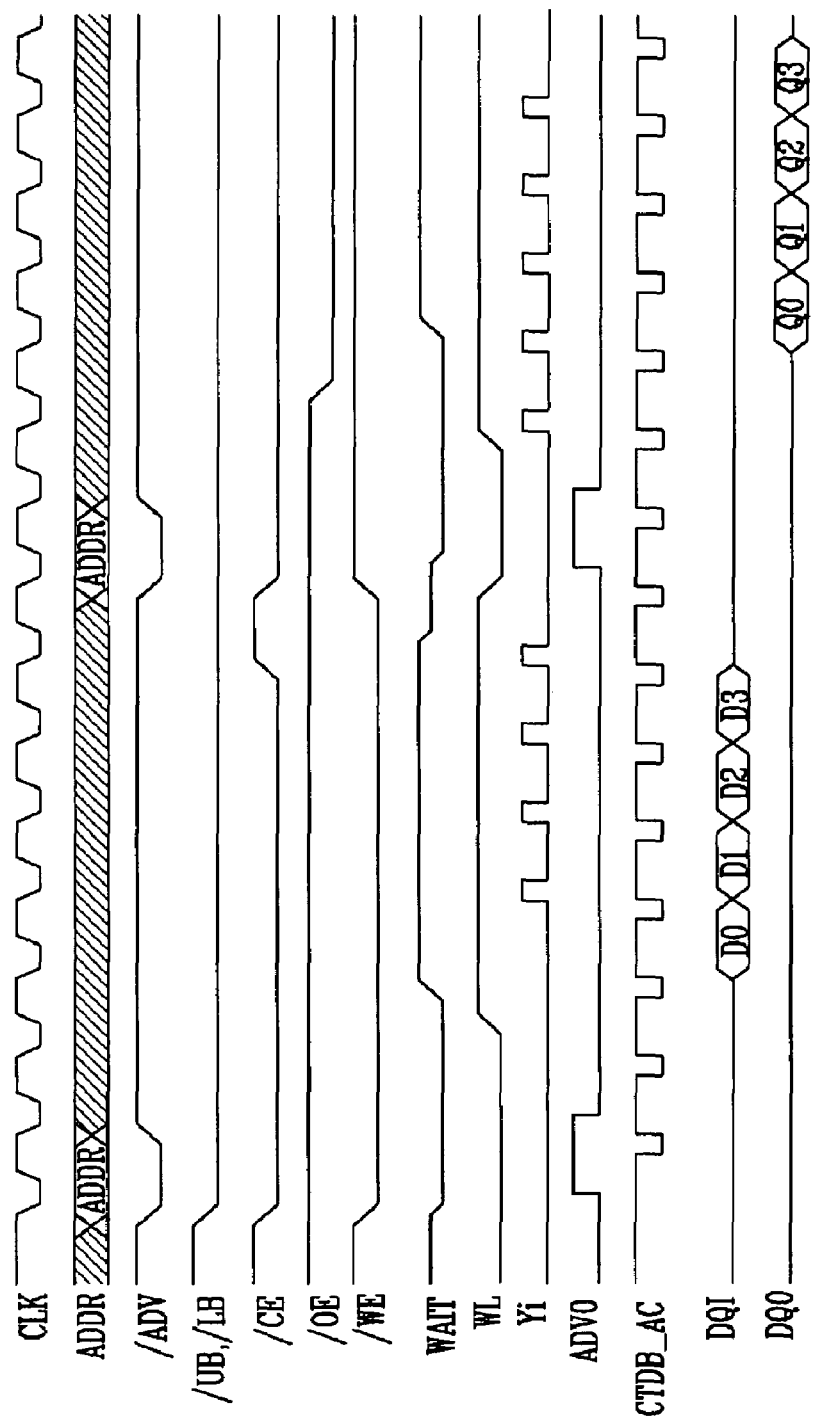
FIG. 2 is a timing diagram of signals related to the operation of the clock control circuit shown in FIG. 1 and buffers for receiving address signals and control signals.
Figure 3:
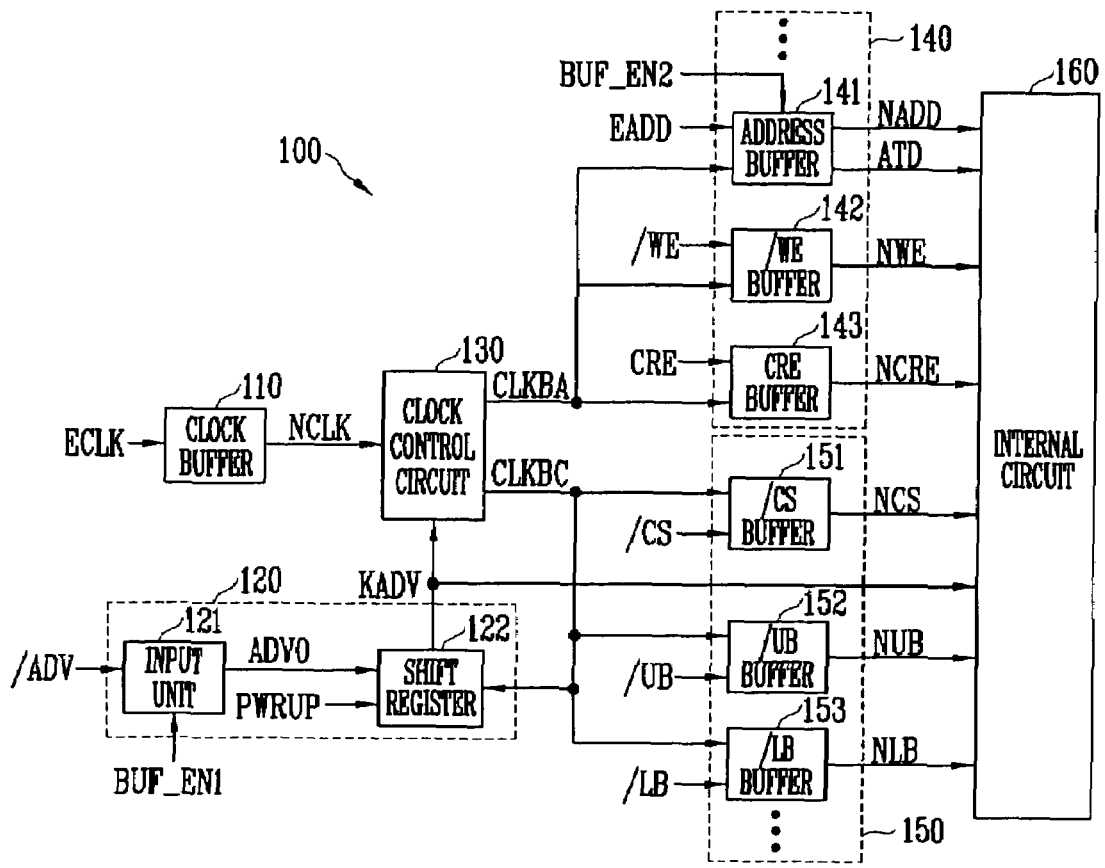
FIG. 3 is a schematic block diagram of a semiconductor memory device including a clock control circuit according to an embodiment of the present invention.

FIG. 3 is a schematic block diagram of a semiconductor memory device including a clock control circuit according to an embodiment of the present invention.

Referring to FIG. 3, the semiconductor memory device 100 includes a clock buffer 10, an address valid signal buffer 120, a clock control circuit 130, a first input buffer unit 140 and a second input buffer unit 150.

The clock buffer 1110 receives an external clock signal (ECLK) and outputs an input clock signal (NCLK).

The address valid signal buffer 120 includes an input unit 121 and a shift register 122. The input unit 121 receives an address valid signal (/ADV) and outputs an input address valid signal (ADV0) in response to buffer enable signal (BUF_EN1). The input unit 121 can be implemented using a logic circuit. For example, in the case where the input unit 121 is implemented using a NOR gate, the input unit 121 outputs the input address valid signal (ADV0) as a logic high when the buffer enable signal (BUF_EN1) and the address valid signal (/ADV) become logic low. The shift register 122 receives the input address valid signal (ADV0) and outputs an internal address valid signal (KADV), in response to a control clock signal (CLKBC).

Figure 5:
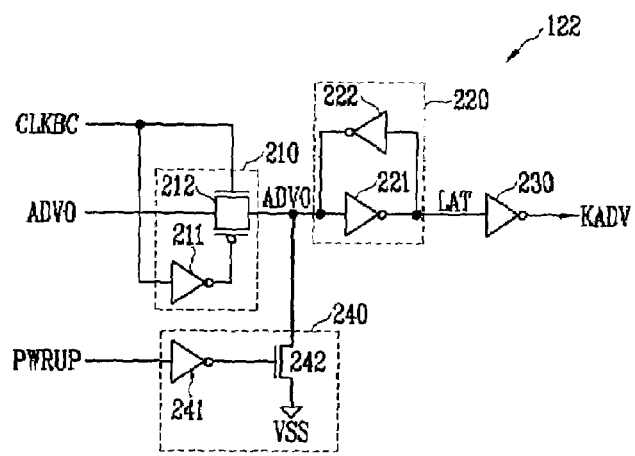
FIG. 5 is a detailed view of the shift register shown in FIG. 3.

The construction and operation of the shift register 122 will be described in more detail with reference to FIG. 5.

The shift register 122 includes a pass circuit 210, a latch circuit 220, an inverter 230 and a latch reset circuit 240.

The pass circuit 210 includes an inverter 211 and a pass gate 212. The inverter 211 inverts the control clock signal (CLKBC). The pass gate 212 is turned on or off in response to the control clock signal (CLKBC) and the output signal of the inverter 211. When the control clock signal (CLKBC) is logic high, the pass gate 212 is turned on to receives the input address valid signal (ADV0) and then output the input address valid signal (ADV0) to the latch circuit 220. The latch circuit 220 includes inverters 221, 222.

The latch circuit 220 latches the input address valid signal (ADV0) received from the pass gate 212 and outputs a latched signal (LAT).

The inverter 230 inverts a latched signal (LAT) and outputs the inverted signal as an internal address valid signal (KADV). Consequently, when the input address valid signal (ADV0) is logic high, the shift register 122 outputs the internal address valid signal (KADV) as logic high in synchronization with a rising edge of the control clock signal (CLKBC). Meanwhile, when the input address valid signal (ADV0) is logic low, the shift register 122 outputs the internal address valid signal (KADV) as logic low in synchronization with a rising edge of the control clock signal (CLKBC).

The latch reset circuit 240 includes an inverter 241 and a NMOS transistor 242. The inverter 241 inverts a power-up signal (PWRUP). The NMOS transistor 242 is turned on or off in response to the output signal of the inverter 241. When the NMOS transistor 242 is turned on, it applies a ground voltage (VSS) to the input terminal of the latch circuit 220. As a result, the latch circuit 220 is reset.

Referring back to FIG. 3, the clock control circuit 130 outputs the control clock signal (CLKBC) and the control clock signal (CLKBA) in response to the input clock signal (NCLK) and the internal address valid signal (KADV).

The first input buffer unit 140 includes an address buffer 141, a write enable signal (/WE) buffer 142 and the mode register signal Configuration Register enable (CRE) buffer 143. The address buffer 141 receives an external address signal (EADD) and outputs an internal address signal (NADD) and an address transition signal (ATD) to an internal circuit 160, in response to the control clock signal (CLKBA) and a buffer enable signal (BUF_EN2). The /WE buffer 142 receives a write enable signal (/WE) and outputs an internal write enable signal (NWE) to the internal circuit 160, in response to the control clock signal (CLKBA). The CRE buffer 143 receives a mode register signal (CRE) and outputs an internal mode register signal (NCRE) to the internal circuit 160, in response to the control clock signal (CLKBA). The first input buffer unit 140 may further include buffers that operate in synchronization with the control clock signal (CLKBA).

The second input buffer unit 150 includes a chip select signal (/CS) buffer 151, an upper byte control signal (/UB) buffer 152 and a lower byte control signal (/LB) buffer 153.

The /CS buffer 151 receives a chip select signal (/CS) and outputs an internal chip select signal (NCS) to the internal circuit 160, in response to the control clock signal (CLKBC).

The /UB buffer 152 receives an upper byte control signal (/UB) and outputs an internal upper byte control signal (NUB) to the internal circuit 160, in response to the control clock signal (CLKBC). The upper byte control signal (/UB) is a signal to control the data I/O operation of I/O buffers corresponding to upper bytes, of data I/O buffers (not shown).

The /LB buffer 153 receives a lower byte control signal (/LB) and outputs an internal lower byte control signal (NLB) to the internal circuit 160, in response to the control clock signal (CLKBC). The lower byte control signal (/LB) is a signal to control the data I/O operation of I/O buffers corresponding to lower bytes, of data I/O buffers (not shown).

The second input buffer unit 150 may further include buffers that operate in synchronization with the control clock signal (CLKBC).

Figure 4:
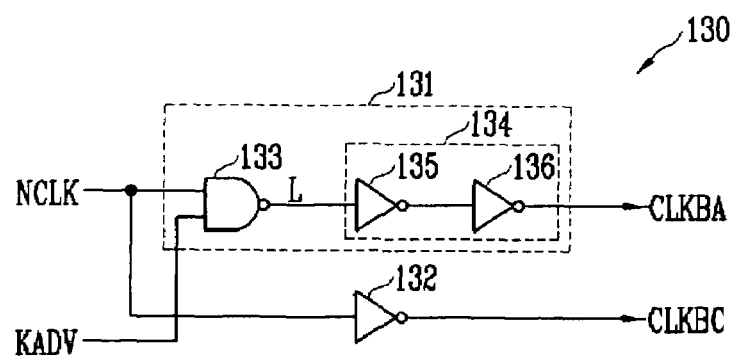
FIG. 4 is a detailed view of the clock control circuit shown in FIG. 3.

FIG. 4 is a detailed view of the clock control circuit shown in FIG. 3. Referring to FIG. 4, the clock control circuit 130 includes a first clock generator 131 and a second clock generator 132. The first clock generator 131 includes a NAND gate 133 and a delay circuit 134. The NAND gate 133 outputs a logic signal (L) in response to the input clock signal (NCLK) and the internal address valid signal (KADV). The delay circuit 134 includes inverters 135, 136 connected in series to the output terminal of the NAND gate 133. The inverters 135, 136 delay the logic signal (L) and output the delayed signal as the control clock signal (CLKBA).

Figure 7:
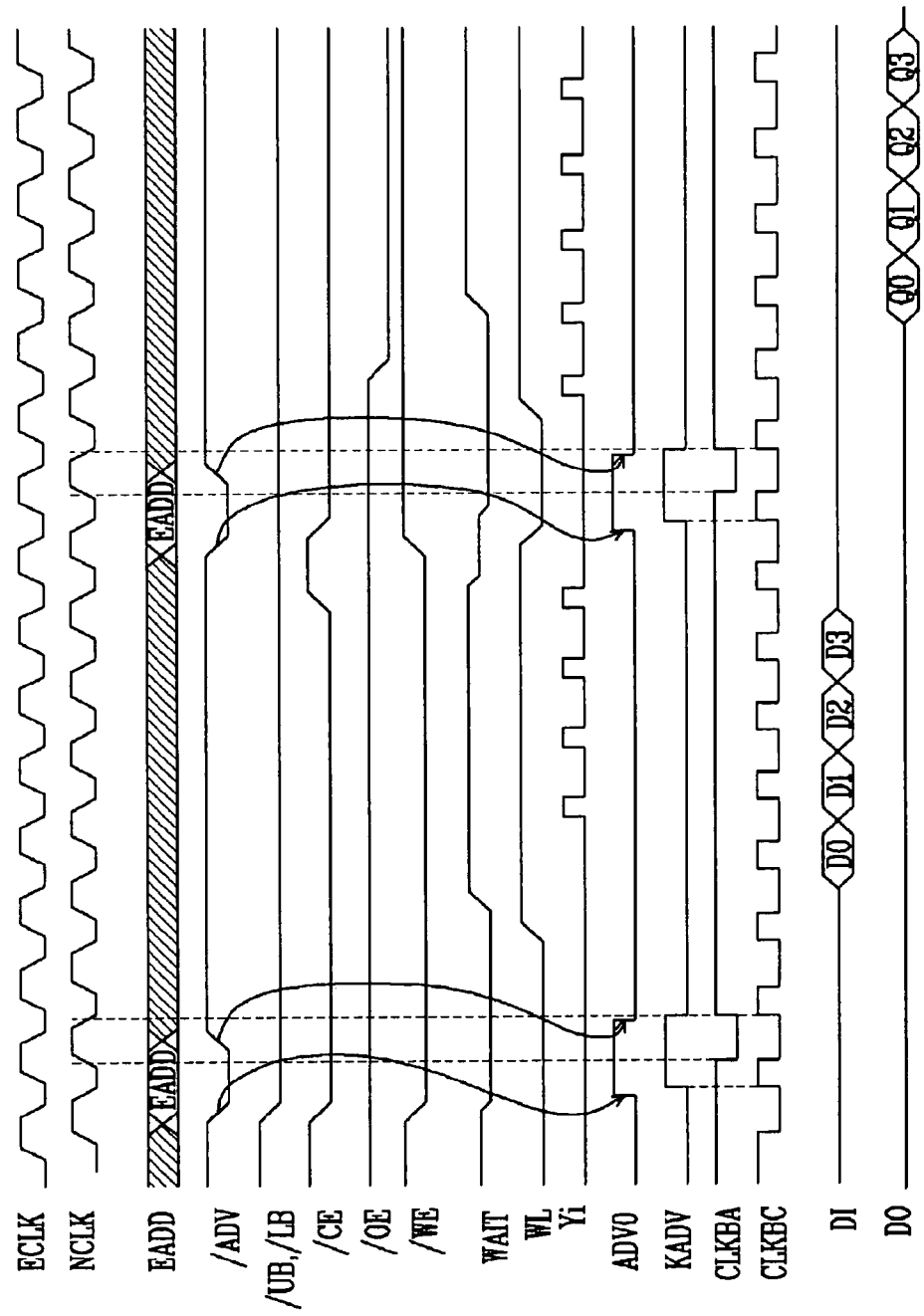
FIG. 7 is a timing diagram of signals related to the operation of inputting address signals and control signals of the semiconductor memory device shown in FIG. 3.

The NAND gate 133 can output the logic signal (L) as logic low when both the input clock signal (NCLK) and the internal address valid signal (KADV) are logic high, as shown in FIG. 7. As a result, the first clock generator 131 outputs the control clock signal (CLKBA) as logic low when both the input clock signal (NCLK) and the internal address valid signal (KADV) are logic high. The second clock generator 132 can be implemented using an inverter. The second clock generator 132 inverts the input clock signal (NCLK) and outputs the inverted signal as the control clock signal (CLKBC). As a result, the control clock signal (CLKBC) has a phase opposite to that of the input clock signal (NCLK).

Figure 6:
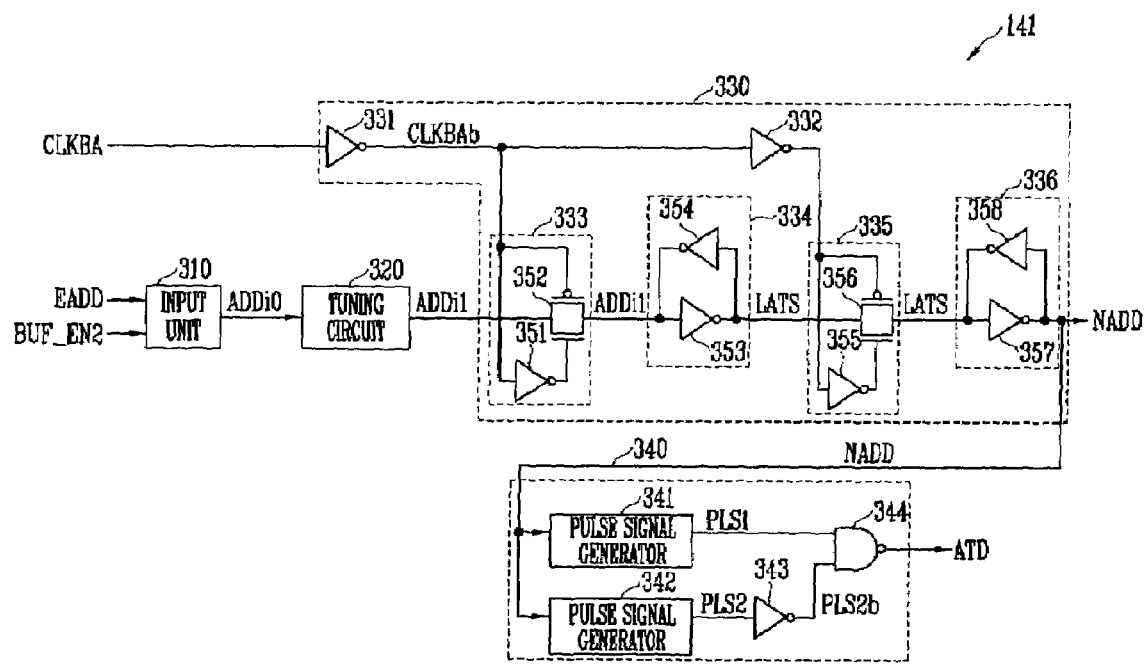
FIG. 6 is a detailed view of the address buffer shown in FIG. 3.

FIG. 6 is a detailed view of the address buffer shown in FIG. 3.

Referring to FIG. 6, the address buffer 141 includes an input unit 310, a tuning circuit 320, a shift circuit 330 and an address transition detection circuit 340.

The input unit 310 receives the external address signal (EADD) and outputs a first input address signal (ADDi0) in response to the buffer enable signal (BUF_EN2).

The tuning circuit 320 controls a setup time and a hold time of the first input address signal (ADDi0) and outputs the second input address signal (ADDi1).

The shift circuit 330 includes inverters 331, 332, pass circuits 333, 335 and latch circuits 334, 336. The inverter 331 inverts the control clock signal (CLKBA) and outputs an inverted control clock signal (CLKBAb). The inverter 332 inverts the inverted control clock signal (CLKBAb) again. The pass circuit 333 includes an inverter 351 and a pass gate 352. The inverter 351 inverts the inverted control clock signal (CLKBAb). The pass-gate 352 is turned on or off in response to the inverted control clock signal (CLKBAb) and the output signal of the inverter 351. When the control clock signal (CLKBA) is logic high, the pass gate 352 is turned on to receive the second input address signal (ADDi1) and outputs it to the latch circuit 334. The latch circuit 334 includes inverters 353, 354. The latch circuit 334 latches the second input address signal (ADDi1) and outputs a latched signal (LATS). The pass circuit 335 includes an inverter 355 and a pass gate 356. The inverter 355 inverts the output signal of the inverter 332. The pass gate 356 is turned on or off in response to the output signals of the inverters 332, 355. When the control clock signal (CLKBA) is logic low, the pass gate 356 is turned on to receive the latched signal (LATS) and outputs it to the latch circuit 336. The latch circuit 336 includes inverters 357, 358. The latch circuit 336 latches the latched signal (LATS) and outputs the latched signal as the internal address signal (NADD).

The address transition detection circuit 340 includes pulse signal generators 341, 342, an inverter 343 and a NAND gate 344. The pulse signal generator 341 outputs a pulse signal (PLS1) of logic low based on the internal address signal (NADD). Furthermore, the pulse signal generator 342 outputs a pulse signal (PLS2) of logic high based on the internal address signal (NADD). The inverter 343 inverts the pulse signal (PLS2) and outputs an inverted pulse signal (PLS2b). The NAND gate 344 outputs the address transition detection signal (ATD) in response to the pulse signal (PLS1) and the inverted pulse signal (PLS2b).

The input operation of the external address signal or the external control signals of the semiconductor memory device 100 will be described in detail with reference to FIG. 7. FIG. 7 is a timing diagram of signals related to the input operation of an address signal or control signals of the semiconductor memory device shown in FIG. 3.

The input operation of the semiconductor memory device 100 in the case where the external address signal (EADD) is input to the semiconductor memory device 100 will be described.

If the clock buffer 110 outputs the input clock signal (NCLK) in response to the external clock signal (ECLK), the second clock generator 132 of the clock control circuit 130 inverts the input clock signal (NCLK) and outputs an inverted signal as the control clock signal (CLKBC).

The address valid signal buffer 120 outputs the internal address valid signal (KADV), which is kept to logic high for a predetermined time, in response to the buffer enable signal (BUF_EN1), the control clock signal (CLKBC) and the address valid signal (/ADV).

The first clock generator 131 of the clock control circuit 130 generates the control clock signal (CLKBA) as logic low during a predetermined time (i.e., while the internal address valid signal (KADV) is enabled) in response to the input clock signal (NCLK) and the internal address valid signal (KADV). This will be described in more detail.

The NAND gate 133 of the first clock generator 131 outputs the logic signal (L) as logic low in response to the input clock signal (NCLK) and the internal address valid signal (KADV). The delay circuit 134 of the first clock generator 131 delays the logic signal (L) and outputs the delayed signal as the control clock signal (CLKBA).

Thereafter, the input unit 310 of the address buffer 141 receives the external address signal (EADD) and outputs the first input address signal (ADDi0), in response to the buffer enable signal (BUF_EN2).

The tuning circuit 320 of the address buffer 141 controls a setup time and a hold time of the first input address signal (ADDi0) and outputs the second input address signal (ADDi1).

The shift circuit 330 of the address buffer 141 shifts the second input address signal (ADDi1) and outputs the shifted signal to the internal circuit 160 as the internal address signal (NADD), in response to the control clock signal (CLKBA). For example, the internal address signal (NADD) can be input to an address decoder (not shown) of the internal circuit 160.

Furthermore, the address transition detection circuit 340 of the address buffer 141 outputs the address transition signal (ATD) to the internal circuit 160 based on the internal address signal (NADD).

As described above, the address buffer 141 operates in response to the control clock signal (CLKBA), which is toggled only when the internal address valid signal (KADV) is enabled. Therefore, an amount of current consumed can be saved. Furthermore, the first clock generator 131 of the clock control circuit 130 generates the control clock signal (CLKBA) only while the internal address valid signal (KADV) is enabled. Therefore, an amount of current consumed can also be saved.

The input operation of the semiconductor memory device 100 in the case where external control signals including first and second control signals are applied to the semiconductor memory device 100 will now be described.

The first control signals include the write enable signal (/WE) and the mode register signal (CRE). The second control signals include the chip select signal (/CS), the upper byte control signal (/UB) and the lower byte control signal (/LB). In the input operation of the external control signal of the semiconductor memory device 100, the process of generating the control clock signals (CLKBA, CLKBC) is the same as that described above. Description thereof will be omitted for simplicity.

The /WE buffer 142 receives the write enable signal (/WE) and outputs the internal write enable signal (NWE) to the internal circuit 160, in response to the control clock signal (CLKBA). Furthermore, the CRE buffer 143 receives the mode register signal (CRE) and outputs the internal mode register signal (NCRE) to the internal circuit 160, in response to the control clock signal (CLKBA).

As described above, the /WE buffer 142 and the CRE buffer 143 operate in response to the control clock signal (CLKBA), which is toggled only while the internal address valid signal (KADV) is enabled. Therefore, an amount of current consumed of each of the /WE buffer 142 and the CRE buffer 143 can also be saved.

Meanwhile, the /CS buffer 151 receives the chip select signal (/CS) and outputs the internal chip select signal (NCS) to the internal circuit 160 in response to the control clock signal (CLKBC). Furthermore, the /UB buffer 152 receives the upper byte control signal (/UB) and outputs the internal upper byte control signal (NUB) to the internal circuit 160, in response to the control clock signal (CLKBC). The /UB buffer 152 also receives the lower byte control signal (/LB) and outputs the internal lower byte control signal (NLB) to the internal circuit 160, in response to the control clock signal (CLKBC).

As described above, the clock control circuit 130 generates the control clock signal (CLKBA) only when the external address signals or the external control signals are substantially input. Therefore, unnecessary power consumption of the semiconductor memory device 100 can be saved.

Furthermore, since unnecessary power consumption of the semiconductor memory device 100 is saved, a power noise phenomenon (i.e., a phenomenon in which a data signal or a control signal passing through a transmission line is influenced by a current flowing through a neighboring power line) of the semiconductor memory device 100 can be reduced.

Furthermore, in the case where the semiconductor memory device 100 is applied to mobile products, the battery time of the mobile products can be extended.

As described above, in accordance to a clock control circuit and semiconductor memory device including the same, and an input operation method of the semiconductor memory device according to the present invention, a control clock signal is generated only when external address signals or external control signals are substantially input. It is thus possible to reduce unnecessary power consumption a power noise phenomenon.

Furthermore, in the case where the semiconductor memory device according to the present invention is applied to mobile products, the battery time of the mobile products can be extended.

Although the foregoing description has been made with reference to the preferred embodiments, it is to be understood that changes and modifications of the present inven-

What is claimed is:

1. A clock control circuit of a semiconductor memory device, comprising:
   a first clock generator that outputs a first control clock signal in response to an input clock signal and an internal address valid signal; and
   a second clock generator that generates a second control clock signal based on the input clock signal,
   wherein first buffers receive first external signals, respectively, and output first internal signals to an internal circuit, in response to the first control clock signal, and second buffers receive second external signals, respectively, and output second internal signals to an internal circuit, in response to the second control clock signal, and
   the first clock generator generates the first control clock signal only while the internal address valid signal is enabled.

2. The clock control circuit as claimed in claim 1, wherein the first clock generator includes
   a NAND gate that outputs a logic signal in response to the input clock signal and the internal address valid signal; and
   a delay circuit that delays the logic signal and outputs the delayed signal as the first control clock signal.

3. The clock control circuit as claimed in claim 1, wherein the second clock generator is an inverter that inverts the input clock signal and outputs the inverted signal as the second control clock signal.

4. The clock control circuit as claimed in claim 1, wherein the first external signals include an external address signal, a write enable signal and a mode register signal, and the second external signals include a chip select signal, an upper byte control signal and a lower byte control signal.

5. A semiconductor memory device that operates in synchronization with an external clock signal, the semiconductor memory device comprising:
   a clock buffer that receives the external clock signal and outputs an input clock signal;
   a clock control circuit that outputs first and second control clock signals in response to the input clock signal and an internal address valid signal;
   an address valid signal buffer that receives an address valid signal and outputs the internal address valid signal, in response to a first buffer enable signal and the second control clock signal;
   a first input buffer unit that receives first external signals and outputs first internal signals to an internal circuit, in response to the first control clock signal; and
   a second input buffer unit that receives second external signals and outputs second internal signals to the internal circuit, in response to the second control clock signal,
   wherein the clock control circuit generates the first control clock signal only while the internal address valid signal is enabled.

6. The semiconductor memory device as claimed in claim 5, wherein the clock control circuit includes:
   a first clock generator that outputs the first control clock signal in response to the input clock signal and the internal address valid signal; and
   a second clock generator that outputs the second control clock signal based on the input clock signal.

7. The semiconductor memory device as claimed in claim 6, wherein the first clock generator includes
   a NAND gate that outputs a logic signal in response to the input clock signal and the internal address valid signal; and
   a delay circuit that delays the logic signal and outputs the delayed signal as the first control clock signal.

8. The semiconductor memory device as claimed in claim 6, wherein the second clock generator is an inverter that inverts the input clock signal and outputs the inverted signal as the second control clock signal.

9. The semiconductor memory device as claimed in claim 6, wherein the address valid signal buffer includes:
   an input unit that receives the address valid signal and outputs an input address valid signal, in response to the first buffer enable signal; and
   a shift register that receives the input address valid signal and outputs the internal address valid signal, in response to the second control clock signal.

10. The semiconductor memory device as claimed in claim 5, wherein the first external signals include an external address signal, a write enable signal and a mode register signal, and
    the first input buffer unit includes:
    an address buffer that receives the external address signal and outputs an internal address signal and an address transition signal to the internal circuit, in response to the first control clock signal and the second buffer enable signal;
    a write enable signal buffer that receives the write enable signal and outputs an internal write enable signal to the internal circuit, in response to the first control clock signal; and
    a mode register signal buffer that receives the mode register signal and outputs an internal mode register signal to the internal circuit, in response to the first control clock signal.

11. The semiconductor memory device as claimed in claim 10, wherein the address buffer includes:
    an input unit that receives the external address signal and outputs an first input address signal, in response to the second buffer enable signal;
    a tuning circuit that controls a setup time and a hold time of the first input address signal and outputs a second input address signal;
    a shift circuit that shifts the second input address signal and outputs the shifted signal as the internal address signal, in response to the first control clock signal; and
    an address transition detection circuit that outputs an address transition signal based on the internal address signal.

12. The semiconductor memory device as claimed in claim 5, wherein the second external signals include a chip select signal, an upper byte control signal and a lower byte control signal, and
    the second input buffer unit includes:
    a chip select signal buffer that receives the chip select signal and outputs an internal chip select signal to the internal circuit, in response to the second control clock signal;
    an upper byte control signal buffer that receives the upper byte control signal and outputs an internal upper byte control signal to the internal circuit, in response to the second control clock signal; and
    a lower byte control signal buffer that receives the lower byte control signal and outputs an internal lower byte control signal to the internal circuit, in response to the second control clock signal.

13. An address input operation method of a semiconductor memory device that operates in synchronization with an external clock signal, the method comprising the steps of:
outputting an input clock signal in response to the external clock signal;
generating a first control clock signal based on the input clock signal;
generating an internal address valid signal in response to an address valid signal and the first control clock signal;
generating a second control clock signal only during a predetermined time in response to the input clock signal and the internal address valid signal; and
receiving an external address signal and outputting an internal address signal and an address transition detection signal, in response to the second control clock signal.

14. The address input operation method as claimed in claim 13, wherein the predetermined time is a time where the internal address valid signal is enabled.

15. The address input operation method as claimed in claim 13, wherein the input clock signal has a phase opposite to that of the first control clock signal.

16. The address input operation method as claimed in claim 13, wherein the step of generating the second control clock signal includes the steps of:
outputting a logic signal in response to the input clock signal and the internal address valid signal; and
delaying the logic signal and outputting the delayed signal as the second control clock signal.

17. The address input operation method as claimed in claim 13, wherein the step of outputting the internal address signal and the address transition detection signal includes the steps of:
receiving the external address signal and outputting a first input address signal, in response to a buffer enable signal;
controlling a setup time and a hold time of the first input address signal and outputting a second input address signal;
shifting the second input address signal and outputting the shifted signal as the internal address signal, in response to the second control clock signal; and
outputting an address transition signal based on the internal address signal.

18. An input operation method of an external control signal including first and second control signals of a semiconductor memory device that operates in synchronization with an external clock signal, the method comprising the steps of:
outputting an input clock signal in response to the external clock signal;
generating a first control clock signal based on the input clock signal;
generating an internal address valid signal in response to an address valid signal and the first control clock signal;
generating a second control clock signal only during a predetermined time in response to the input clock signal and the internal address valid signal;
receiving the first control signals in response to the first control clock signal; and
receiving the second control signals in response to the second control clock signal.

19. The input operation method as claimed in claim 18, wherein the predetermined time is a time where the internal address valid signal is enabled.

20. The input operation method as claimed in claim 18, wherein the input clock signal has a phase opposite to that of the first control clock signal.

21. The input operation method as claimed in claim 18, wherein the step of generating the second control clock signal includes the steps of:
outputting a logic signal in response to the input clock signal and the internal address valid signal; and
delaying the logic signal and outputting the delayed signal as the second control clock signal.

22. The input operation method as claimed in claim 18, wherein the first control signals include a chip select signal, an upper byte control signal and a lower byte control signal, and the second control signals include a write enable signal and a mode register signal.

23. The input operation method as claimed in claim 22, wherein the step of receiving the first control signals includes the steps of:
receiving the chip select signal and outputting an internal chip select signal, in response to the first control clock signal;
receiving the upper byte control signal and outputting an internal upper byte control signal, in response to the first control clock signal; and
receiving the lower byte control signal and outputting an internal lower byte control signal, in response to the first control clock signal.

24. The input operation method as claimed in claim 22, wherein the step of receiving the second input signals includes the steps of:
receiving the write enable signal and outputting an internal write enable signal, in response to the second control clock signal; and
receiving the mode register signal and outputting an internal mode register signal, in response to the second control clock signal.

* * * * *